United States Patent [19]
Baldwin et al.

[11] Patent Number: 5,672,913
[45] Date of Patent: Sep. 30, 1997

[54] SEMICONDUCTOR DEVICE HAVING A LAYER OF GALLIUM AMALGAM ON BUMP LEADS

[75] Inventors: Daniel Flanagan Baldwin, Monmouth Junction; Rajan D. Deshmukh, Trenton, both of N.J.

[73] Assignee: Lucent Technologies Inc., Murray Hill, N.J.

[21] Appl. No.: 663,336

[22] Filed: Jun. 13, 1996

Related U.S. Application Data

[63] Continuation of Ser. No. 393,607, Feb. 23, 1995, abandoned.

[51] Int. Cl.$^6$ .................. H01L 23/48; H01L 23/52; H01L 29/40
[52] U.S. Cl. .................. 257/737; 257/738; 257/762; 257/763; 257/764; 257/766; 257/768
[58] Field of Search .................. 257/737, 738, 257/747, 757, 762, 763, 764, 765, 766, 767, 768, 769, 770

[56] References Cited

U.S. PATENT DOCUMENTS

| | | | |
|---|---|---|---|
| 3,886,578 | 5/1975 | Eastwood et al. | 257/768 |
| 4,396,900 | 8/1983 | Hall | 257/766 |
| 5,053,195 | 10/1991 | MacKay | 420/555 |
| 5,061,442 | 10/1991 | Ozimek | 420/526 |
| 5,225,157 | 7/1993 | MacKay | 420/525 |
| 5,373,192 | 12/1994 | Eguchi | 257/765 |

OTHER PUBLICATIONS

C.A. MacKay and G. Schuldt, "Applications of Amalgams in Microelectronic Bonding," ASM Electronics Mats. Congress, Cambridge, Massachusetts, Aug. 1992.

C.A. MacKay, "Amalgams for Improved Electronics Interconnection," *IEEE Micro*, Apr. 1993, pp. 46–58.

*Primary Examiner*—Carl W. Whitehead, Jr.
*Attorney, Agent, or Firm*—R. B. Levy

[57] ABSTRACT

A semiconductor chip (10) has a plurality of metallized members (12) that are each advantageously bumped with a volume of gallium amalgam (18) to render the members wettable by a conventional solder.

20 Claims, 1 Drawing Sheet

SEMICONDUCTOR DEVICE HAVING A LAYER OF GALLIUM AMALGAM ON BUMP LEADS

This is a continuation of application Ser. No. 08/393,607, filed Feb. 23, 1995, now abandoned.

TECHNICAL FIELD

This invention relates to an electronic device having metallized members that are bumped (augmented) with an electrically conductive, solder-wettable material, and to a method of forming such bumps on the metallized members of the device.

BACKGROUND ART

Most electronic equipment comprises individually packaged integrated circuits that are soldered to a substrate, such as a printed circuit board. To achieve greater functionality with reduced cost, some manufacturers now attach bare semiconductor chips directly to a circuit board, thereby eliminating the need to package each chip prior to attachment to the board. Direct chip attachment has been impeded by the inability to solder bond each metallized member (bonding pad) on the chip to a corresponding bond site on the circuit board without some preliminary processing. Often, the metallization of each member on the chip (usually aluminum) is not compatible with conventional solders (e.g., tin/lead solders) that are used to bond electronic devices to a circuit board. Thus, to overcome the incompatibility between the metallized members on the chip and conventional tin/lead solders, the metallized members on the chip are usually bumped (augmented) with a metallization that is solder-compatible.

Presently, chips are bumped by either depositing or evaporating one or more layers of metallization on each metallized member, or by bonding a stud wire to the metallized member on the chip. Bumping the bond sites by evaporation/deposition is a slow, costly process that usually must be carried out in a clean room. Further, in order to effectively evaporate or deposit a suitable metallization on each metallized member of the chip, extensive pre-metallization of the bonds may be necessary. Stud wire bumping is disadvantageous because the process may cause cavitation of the chip. Further, stud wire bumping is slow because the bump must be applied to each metallized member of the chip individually.

Thus, there is a need for a technique for bumping each metallized member with a solder-compatible metallization in a rapid, cost efficient manner.

BRIEF SUMMARY OF THE INVENTION

Briefly, in accordance with one aspect of the invention, there is provided an electronic device, such as a semiconductor chip, having metallized members (bonding pads) typically formed from aluminum or the like. To render the members of the device wettable by a conventional solder, such as a tin/lead solder or the like, each member is bumped with a volume of gallium amalgam. The gallium amalgam reacts and bonds with the metallization on the metallized members on the device to render them wettable by conventional solders. In this way, the device, with its gallium amalgam-bumped members, can be solder bonded to a circuit board, or the like. Moreover, the gallium amalgam-bumped members of the device can be bonded directly to bare copper metallized bond sites on the circuit board.

In accordance with another aspect of the invention, a method is provided for bumping the metallized members of the device with gallium amalgam. The bumping method of the invention is practiced by placing a stencil, having openings therein arrayed the same as the members on the device, in registration with the device so that each member is exposed through a corresponding stencil opening. The stencil, together with a squeegee blade, as well as the device, with its metallized members, are all heated to a preselected temperature. A volume of gallium amalgam is applied to a squeegee blade in contact with the stencil. The squeegee blade is displaced across the stencil to force the gallium amalgam through the stencil openings and onto the metallized members. In this way, each metallized member is bumped with a volume of the gallium amalgam.

DETAILED DESCRIPTION

Figure 1:
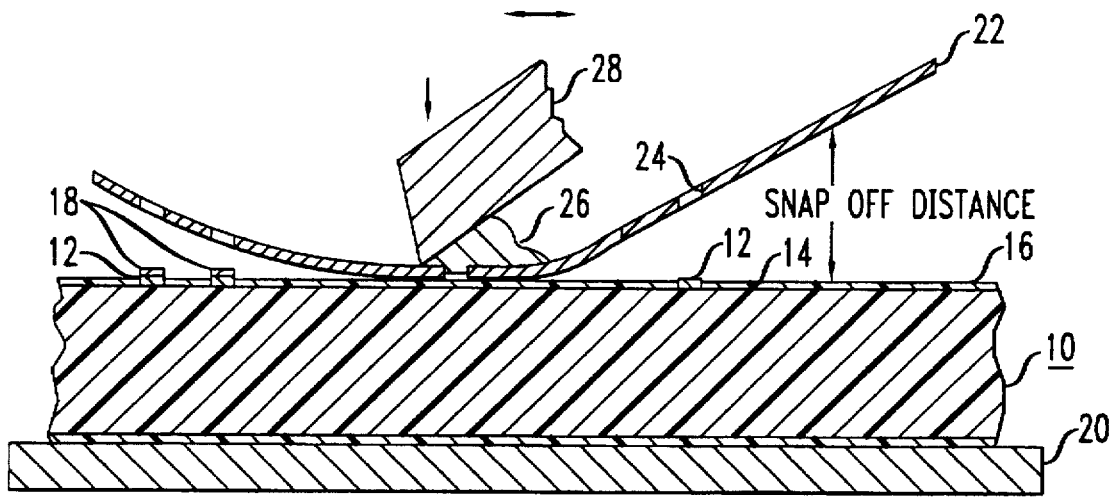
FIG. 1 is a side view, in cross section, of an electronic device having a plurality of metallized areas bumped with gallium amalgam in accordance with the invention.
Figure 2:
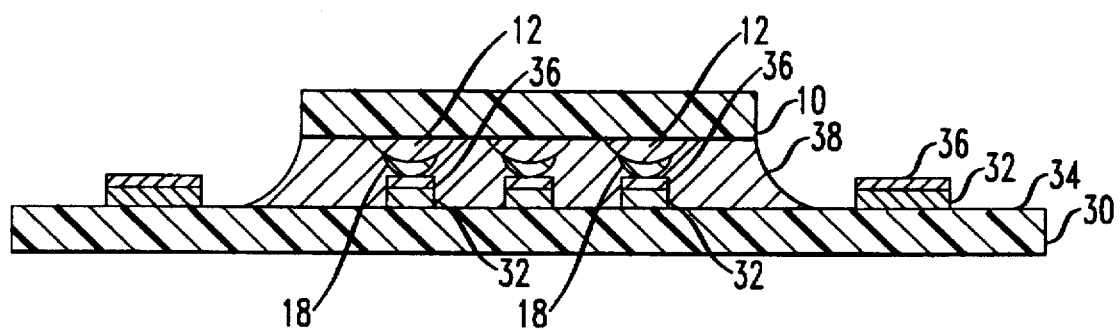
FIG. 2 is a side view, in cross section, of a device of FIG. 1 solder-bonded to a printed circuit board.

FIGS. 1 and 2 illustrate an electronic device 10, such as a semiconductor chip, having a plurality of metallized members 12 on a major surface 14. (In FIG. 1, the chip 10 is depicted upside down from its normal orientation depicted in FIG. 2.) In the illustrated embodiment, the device 10 is fabricated from silicon in a conventional manner so that the surface 14 carries a plurality of passivation regions 16 that separate adjacent metallized members 12. Typically, the metallized members 12 on the surface 14 are formed from aluminum, a metal that is generally not wettable by the solder (e.g., tin/lead solder) that is conventionally used within the electronics industry.

Presently, there is much interest in directly attaching the device 10 to a circuit board 16 as seen in FIG. 2 to achieve high device density at a reduced cost. To accomplish such direct device attachment, the metallized members 12 must be bumped with a metallization that is compatible with conventional solders. Past techniques, such as sputtering/ evaporation/deposition and stud wire bumping, have not proved themselves suitable for inexpensively bumping a large volume of devices 10. To overcome this problem, a technique is provided in accordance with the invention for bumping each member 12 on the device 10 with a gallium amalgam bump 18, thereby yielding a device whose members each have a metallization that is compatible with conventional solders.

Referring to FIG. 1, to bump the members 12 with the gallium amalgam 18, the device 10 is placed on a heated platen 20 whose temperate may be controlled. Typically, the temperature of the platen 20 is held at 50°–90° C to maintain the device 10 at about the same temperature. While the device 10 is heated on the platen 20, a stencil 22, typically stainless steel or the like, is placed at a prescribed height ("snap-off" distance) from the device surface 14. The stencil 22 has a plurality of apertures 24 arrayed the same as the pattern of members 12 on the device 10. When placed above the device 10, the stencil 22 is oriented so each stencil opening 24 lies in aligned registration with a corresponding member 12 on the device.

Like the device 10, the stencil 22 is also heated, either from the heat radiated by the device, or by a separate heater (not shown). Once the stencil 22, the device 10, and the members 12 have all been heated to the preselected temperature, then a volume of gallium amalgam 26, at the selected temperature, is deposited on the stencil 24 to one side of a squeegee blade 28 in contact with the stencil. Like the stencil 24, the squeegee blade 28 is also heated to the selected temperature. A print mechanism (not shown), similar to a conventional stencil print mechanism, urges the blade against the stencil 24 while simultaneously displacing it across the stencil. As it travels across the stencil 24, the blade 28 forces the amalgam 26 through the stencil openings 24 and onto the members 12 to yield the amalgam bumps 18.

The nature of the squeegee blade 28, together with the composition of the amalgam 26, and the nature of the device 10, will determine the number of passes the squeegee blade must make across the stencil 24. In some instances one or two passes of the stencil are sufficient. In other circumstances as many as six passes may be necessary to obtain a sufficient volume for the amalgam bumps.

The composition of the gallium amalgam 26 depends in large measure on the nature of the metallization of the members 12 on the device 10. When the members 12 are formed of aluminum, the gallium amalgam 26 preferably includes aluminum as well as gallium. For example, an amalgam comprising 11% aluminum by weight, with the remainder being mostly gallium, may be utilized to bump the members 12 when the members are formed from aluminum. Additionally, a barrier compound/element (for example, titanium, platinum or chromium) may be added to such an aluminum-gallium amalgam to form a surface barrier and adhesion layer on the aluminum to impede its dissolution by the gallium in the amalgam.

In some instances, the members 12 may be fabricated from aluminum, or another metallization that has been augmented (bumped) with successive barrier layers (not shown) of titanium, platinum, and gold, respectively, or with a barrier metallization comprised of successive layers of chromium, chromium-copper, copper and gold. Under such circumstances, the gallium amalgam 26 typically comprises gallium, copper and nickel, the largest constituent by weight being gallium, followed by copper, followed by nickel. We have found that a mixture of 65% (by weight) gallium, 30% copper and 5% nickel, as well as a mixture of 75% gallium, 21.4% copper and 3.6% nickel has proved suitable.

FIG. 2 shows the manner in which the device 10 of FIG. 1, once bumped, is mounted to a substrate 30. In the illustrated embodiment, the substrate 30 comprises a printed circuit board having a plurality of metallized traces 32 (e.g., copper) on its upper surface 34. To mount the device 10 to the circuit board 30, the metallized traces 32 that are to be bonded to the bumped members 12 of the device are typically bumped with a volume 36 of solder. The solder 36 typically comprises a tin/lead solder as is conventionally used in the electronics industry for bonding purposes. The traces 32 may be bumped with solder in a variety of ways. For example, the traces 32 may be screen printed with solder paste in a manner similar to the manner in which the members 12 are bumped with the gallium amalgam 26. Alternatively, the traces 32 may be plated with solder.

In practice, the circuit board 30, which is typically fabricated from FR-4 or the like, has a different coefficient of expansion from the device 10 which is typically made from silicon. In an effort to minimize the stresses due to the differences in the coefficients of expansion of the chip 10 and the circuit board 30, an underfill material 38, such as Hysol FP 4511, is typically applied between the chip and the circuit board following placement of the device 10 on the substrate 30 and after the gallium amalgam bumps have had an opportunity to react with the solder bumped traces 32. Preferably, the underfill material 38 is applied after bonding of the gallium bumped members 10 of the device to the solder bumped traces 32 (such as after reflow of the solder). Once applied, the underfill material 38 is cured at a temperature of approximately 150° C.

In some instances, it may be desirable to bond the device 10, with its members 12 bumped with the gallium amalgam bumps 18, directly to the traces 32 without bumping the traces with solder. We have found that the device 10, when its members are bumped with the gallium amalgam bumps 18, can indeed be bonded directly to the bare copper traces 32 as well as to gallium amalgam-bumped copper traces (not shown).

In addition to the gallium-aluminum and gallium-based amalgams described, gallium-tin, gallium-indium and gallium-tin-indium-based amalgams should also prove suitable for bumping the members 12 for soldering bonding to the printed circuit board 30. Further, such gallium-tin, gallium-indium and gallium-tin-indium-based amalgams should also prove suitable for bumping the members 12 on the device 10 to permit direct bonding of the members to the bare copper traces 32 of the circuit board 30 or the like.

The gallium amalgams described above tend to become hard after a few hours at elevated temperatures or after a several days at room temperature. To extend their shelf-life, such amalgams may be frozen at a temperature between 0° to 20° C, depending on the composition of the amalgam.

It is to be understood that the above-described embodiments are merely illustrative of the principles of the invention. Various modifications and changes may be made thereto by those skilled in the art which will embody the principles of the invention and fall within the spirit and scope thereof.

What is claimed is:

1. An apparatus comprising, in combination, an electronic device comprised of a planar surface having a plurality of non-solder wettable metallized members arrayed on said surface, and a circuit board having a plurality of solder-coated metallized areas arrayed the same as the metallized members on said electronic device for bonding thereto, the improvement wherein said electronic device comprises at least one layer of gallium amalgam on said metallized members and having a pattern corresponding to the array of metallized members to render said members wettable by the solder of the metallized areas on the circuit board.

2. The apparatus according to claim 1 wherein the metallized members have an aluminum metallization and wherein the gallium amalgam contains aluminum as well as gallium.

3. A device according to claim 1, wherein said at least one patterned layer of gallium amalgam comprises a surface barrier layer contiguous with said metallized members.

4. The apparatus according to claim 3, wherein the surface barrier layer comprises layers of chrome, chrome-copper, copper and gold, and wherein the gallium amalgam comprises gallium, copper and nickel.

5. The apparatus according to claim 1, wherein the gallium amalgam comprises a barrier compound.

6. The apparatus according to claim 5, wherein said barrier compound comprises titanium, platinum, or chromium.

7. The apparatus according to claim 2 wherein the gallium amalgam contains approximately 11% aluminum.

8. An electronic device comprising,
   a planar surface having a plurality of non-solder wettable metallized members arrayed on said surface; and at least one layer of gallium amalgam on said metallized members and having a pattern corresponding to the array of metallized members of said electronic device to render said members solder wettable.

9. A device according to claim 8, wherein said at least one patterned layer of gallium amalgam comprises a surface barrier layer contiguous with said metallized members.

10. The apparatus according to claim 8, wherein the gallium amalgam comprises a barrier compound.

11. The apparatus according to claim 3, wherein the surface barrier layer comprises layers of titanium, platinum and gold.

12. The apparatus according to claim 4 wherein the gallium amalgam comprises at least 65% by weight gallium, 21.4% copper and 3.6% nickel.

13. The apparatus according to claim 10, wherein said barrier compound comprises titanium, platinum, or chromium.

14. An apparatus according to claim 6, wherein said barrier compound is titanium.

15. An apparatus according to claim 13, wherein the barrier compound or element is titanium.

16. An apparatus comprising, in combination, an electronic device comprised of a planar surface having a plurality of non-solder wettable metallized members arrayed on said surface and a circuit board having a plurality of solder-coated metallized areas arrayed the same as the metallized members on said electronic device for bonding thereto, wherein said electronic device comprises at least one layer of gallium amalgam on said metallized members and having a pattern corresponding to the array of metallized members to render said members wettable by the solder of the metallized areas on said circuit board, and wherein the gallium amalgam contains a titanium barrier compound.

17. An apparatus according to claim 16, wherein the at least one layer of gallium amalgam comprises a surface barrier layer contiguous with the metallized members.

18. An apparatus according to claim 1, wherein the electronic device is a semiconductor chip.

19. An electronic device according to claim 9, wherein the electronic device is a semiconductor chip.

20. An apparatus according to claim 16, wherein the electronic device is a semiconductor chip.

* * * * *